(12) United States Patent
Pavan

(10) Patent No.: US 6,304,134 B1
(45) Date of Patent: Oct. 16, 2001

(54) HIGH-FREQUENCY BOOST TECHNIQUE

(75) Inventor: Shanthi Y. Pavan, Piscataway, NJ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/537,636

(22) Filed: Mar. 29, 2000

(51) Int. Cl.$^7$ ....................................................... H03B 1/00
(52) U.S. Cl. ........................................... 327/552; 327/558
(58) Field of Search ..................... 327/336, 339, 327/341, 345, 551, 552, 553, 555, 556, 557, 558, 559

(56) References Cited

U.S. PATENT DOCUMENTS

| | | | |
|---|---|---|---|
| 4,771,196 | * 9/1988 | Mead et al. | 307/605 |
| 5,293,086 | * 3/1994 | Tanigawa et al. | 307/520 |
| 5,625,317 | * 4/1997 | Deveirman | 327/353 |
| 5,886,586 | * 3/1999 | Lai et al. | 332/109 |
| 5,912,583 | 6/1999 | Pierson et al. | 327/553 |
| 5,994,951 | 11/1999 | Mazhar et al. | 327/553 |
| 6,184,748 | * 2/2001 | Rao et al. | 327/552 |

OTHER PUBLICATIONS

A 3V 10–100 MHz Continuous–Time Seventh–Order 0.05° Equiripple Linear–Phase Filter, N. Rao V. Balan, R. Contreras; 1999 IEEE International Solid–State Circuits Conference, Session 2, Paper MP 2.6.

Design of a Bipolar 10–MHz Programmable Continuous–Time 0.05° Equiripple Linear Phase Filter; Geert A. DeVeirman and Richard G. Yamasaki; IEEE Journal of Solid–State Circuits, vol. 27, No. 3, Mar. 1992.

\* cited by examiner

*Primary Examiner*—Jeffrey Zweizig
(74) *Attorney, Agent, or Firm*—W. Daniel Swayze, Jr.; W. James Brady; Frederick J. Telecky, Jr.

(57) ABSTRACT

A continuous time filter being operable to boost of an input signal including a first integrator to input the input signal and to integrate the input signal and to output a first integrated signal, a second integrator coupled to the first integrator to input the first integrated signal and to integrate the first integrated signal and to output a second integrated signal, and a third integrator coupled to the second integrator to input the second integrated signal and to integrate the second integrated signal and to output a third integrated signal.

5 Claims, 5 Drawing Sheets

HIGH-FREQUENCY BOOST TECHNIQUE

FIELD OF THE INVENTION

The present invention pertains in general to continuous time filters, and more particularly to a continuous time filter having an arrangement of transconductor elements that provides programmable high-frequency boost to the continuous time filter. The present invention relates to continuous time filters for use in a read channel of a disk drive.

BACKGROUND OF THE INVENTION

Filters are input/output devices that reject or pass signals based on their frequency content; that is, the distribution of their energy across a range of frequencies. Every filter has a pass band that defines its effect on the frequency content of the input signals. For example, low-pass filters pass signal frequencies below a certain frequency known as a cut-off frequency and reject frequencies above the cut-off frequency, whereas high-pass filters pass frequencies above a cut-off frequency. In contrast, band-pass filters pass frequencies that are between upper and lower cut-off frequencies.

In addition to their pass-band characteristics, filters are also characterized according to their construction and temporal operation. Filters typically include a network of resistors and capacitors and transistors which define the pass band or frequency response. When most of these components are fabricated on a common substrate or foundation, the filter is known as an integrated filter. As for temporal operation, filters operate either in continuous time, which allows their inputs and outputs to change at any time, or in discrete time, which allows changes at only specific time increments.

The use of continuous time filters that utilize one or more transconductor stages and having a bandwidth that is a function of the transconductance $G_m$ of each of the stages is becoming more widespread. This $G_m$ value can vary as a result of process variations, temperature variations, etc.

Particularly at high frequencies, the transconductance-capacitor ($G_m$-C) technique has emerged as a design approach based on biquad building blocks as well as LC ladder simulations. Compared to operational amplifiers, transconductances generally result in simpler circuitry with fewer undesirable and hard-to-model parasitics which allows for superior high-frequency performance. Although some bipolar circuits have been used, most recent attention has focused on CMOS design.

Typically, when the continuous time filter is used in connection with a read channel of a disk drive, the filter is placed inside the automatic gain control (AGC) loop where it can be used to perform a dual role. It can cut off high-frequency noise in an amplified read signal resulting in lower bit error rates. A second filter objective is to equalize the bit stream (i.e., to slim the data pulses), allowing higher bit densities. Additionally, to minimize pulse peak shifts in time, a filter with a linear phase behavior (or constant group delay) is desired. Furthermore, the filter's group delay should be independent of the amount of equalization. This equalization can be accomplished typically with a feed-forward design.

In many communication systems, such as hard disk drive, tape and optical drive, analog adaptive filters are used to equalize the channel response or, in other words, the bit stream. As a result of the limited programmability of analog systems, the "adaptiveness" of the continuous time filter (CTF) is restricted to programming bandwidth and the addition of programmable high-frequency boost at every bandwidth setting.

FIG. 1 illustrates the effects of the programming of bandwidth without boost. In contrast, FIG. 2 illustrates the effect of boost programming with one bandwidth setting. The boost programming should not be dependent on the bandwidth setting. The boost programming should alter only the magnitude response of the filter. The phase and group delay response should not change.

The DC gain of the filter must be reduced such that the maximum value of the magnitude response remains relatively constant irrespective of the boost value. This aspect is shown in FIG. 3. However, turning back to FIG. 2, it can be seen that with increasing boost, the cutoff frequency increases.

In FIG. 3, it can be seen that the gain increases with increasing the boost. Typically, the transfer function of the filter is an equiripple group delay approximation, usually fifth or seventh order. Butterworth responses have also been used.

FIG. 4 illustrates a schematic of conventional boost circuit. To implement boost, a differentiated version ($k_1 s V_{in}$) The present invention relates to continuous time filters for use in a read channel of a disk drive.) of the input signal $V_{in}$ is injected into the internal node of the second order section. The response of the biquad in the absence of boost, where $k_1=0$, is denoted as H(s), where $$H(s) = \frac{1}{D(s)} \quad (1)$$

If $k_1 \neq 0$, it can be shown that Equation 2 holds.

$$H'(s) = \frac{1 - k_1 s^2}{D(s)} \quad (2)$$

Most high-speed filter designs use the $G_m$-C technique to realize integrators. The schematic of a $G_m$-C biquad is shown in FIG. 5. In this figure, the transconductors are digitally tunable in order to realize bandwidth programming.

In order to implement boost, a differentiated version of the input signal $V_{in}$ needs to be injected into capacitors 502 and 504. This can be implemented in two ways. The schematic of the circuit is illustrated in FIG. 6. The voltage amplifier with a programmable gain $k_1$ is coupled by means of floating capacitors 602 and 604 to capacitors 502 and 504, respectively. However, this approach has various problems. The finite output impedance of amplifier $k_1$ causes aberrations in the frequency response of the filter as the bandwidth is programmed. In other words, the response of the filter degrades progressively as the bandwidth is increased. Additionally, the parasitic capacitance of the bottom plate of capacitors 602 and 604 is not accurately determinable, and this results in uncertainty in the frequency response. The circuit of FIG. 6 results in a noisy differentiation process.

Reducing DC gain in the presence of programmed boost is accomplished by reducing the level of the input signal to the filter. A reduced input signal results in the filter being susceptible to noise.

Another technique is illustrated in FIG. 7. Here, the differentiated version of the input signal is tapped off from a node of a previous biquad. This input signal is converted into a current by the transconductance ($k_1 G_m$) and injected into capacitors 502 and 504. However, this circuit has problems including the output of the transconductor changes as the boost is programmed at a fixed bandwidth setting. This problem is especially serious in CMOS designs where output impedances are already low. Due to this change in output impedance, the phase and group delay responses change as boost is varied. Additionally, the programmable transconductor ($k_1G_m$) needs to be programmable by a much larger range because boost programming, which is determined by $k_1$, and bandwidth programming, which is determined by $G_m$, are implemented in the same transconductor. This is possible in bipolar designs because of the exponential nature of the devices but difficult to perform in CMOS technology without serious power penalties. Furthermore, it is still difficult to reduce the DC gain as boost is programmed.

SUMMARY OF THE INVENTION

The present invention employs a follow-the-leader (FLF) approach. A third order filter section is implemented. The boost is implemented by adding the outputs of the first and third integrators (i.e., the voltages across the capacitors of the respective integrators) in a weighted fashion. The present invention uses a digital programmable transconductor with constant input capacitance.

DETAILED DESCRIPTION OF THE PRESENT INVENTION

Figure 1:
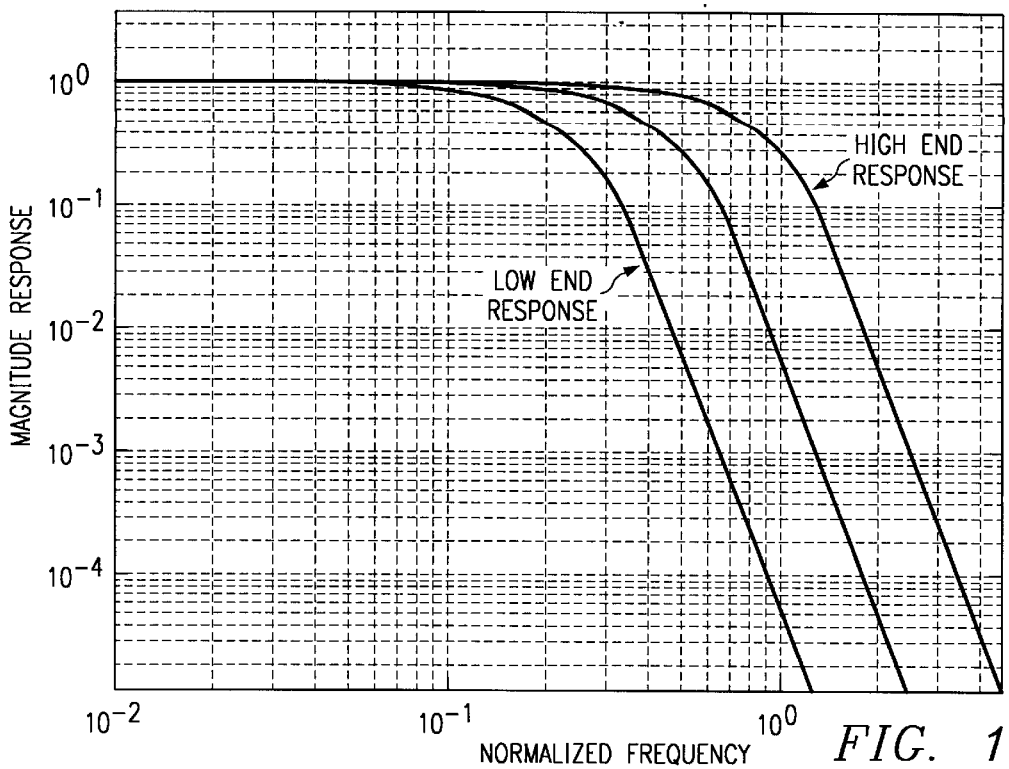
FIG. 1 illustrates the relationship of bandwidth programming with no boost.
Figure 2:
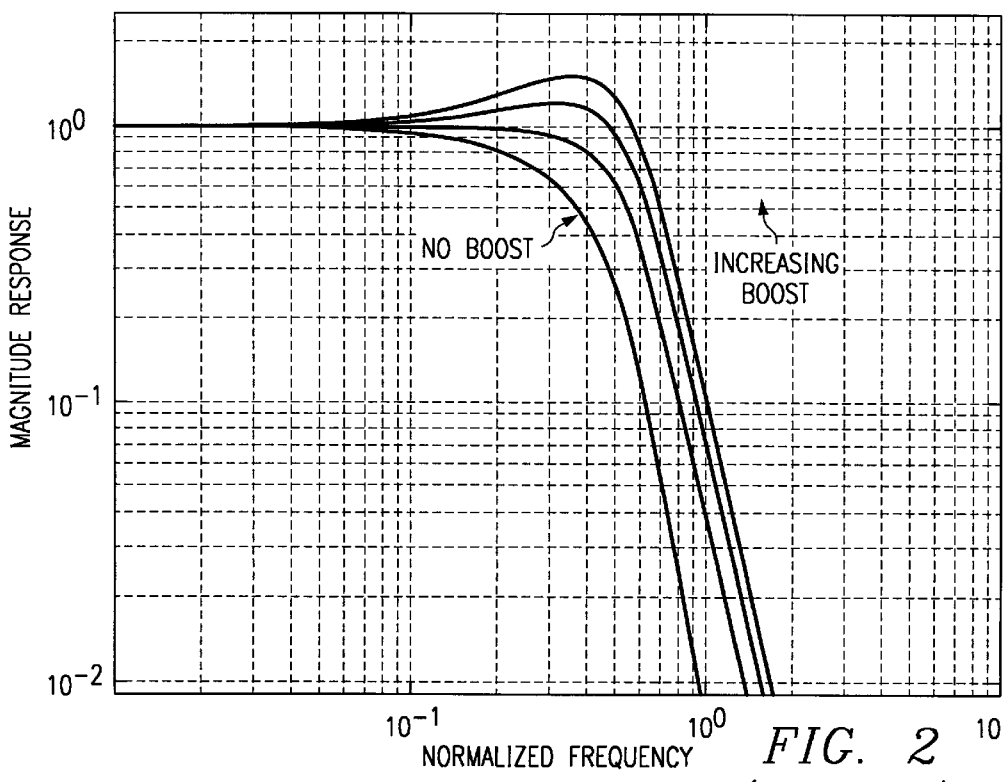
FIG. 2 illustrates the relationship of bandwidth programming at one bandwidth setting.
Figure 3:
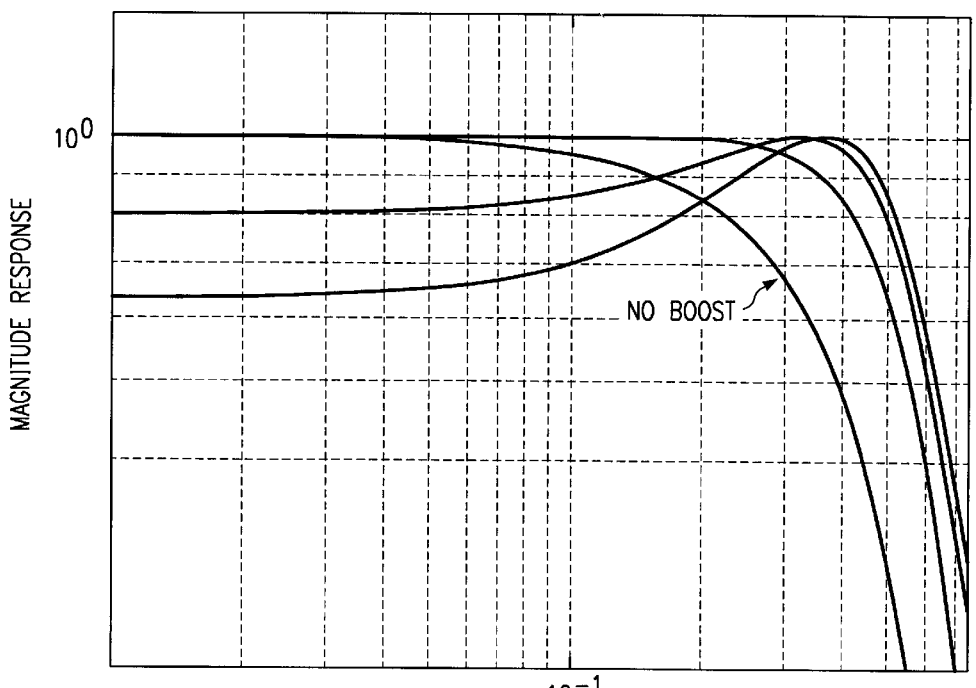
FIG. 3 illustrates the DC gain of the filter.
Figure 4:
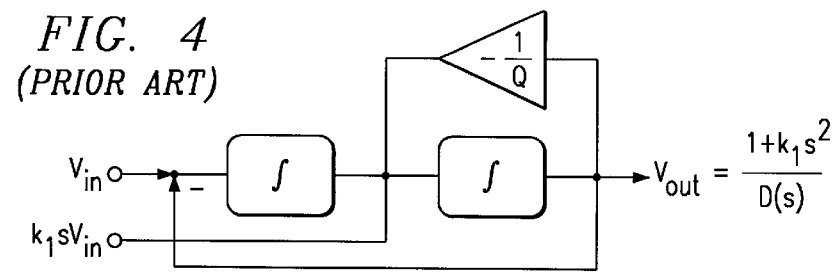
FIG. 4 illustrates the implementation of programmable boost.
Figure 5:
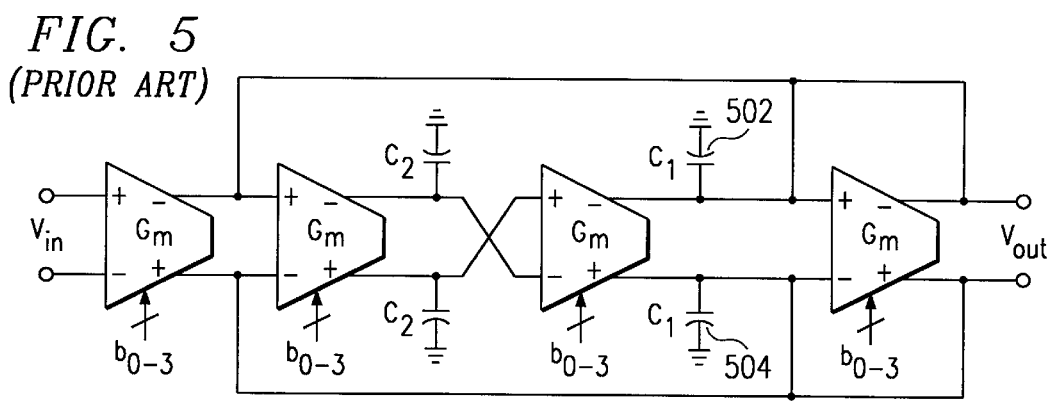
FIG. 5 illustrates a transconductance biquad.
Figure 6:
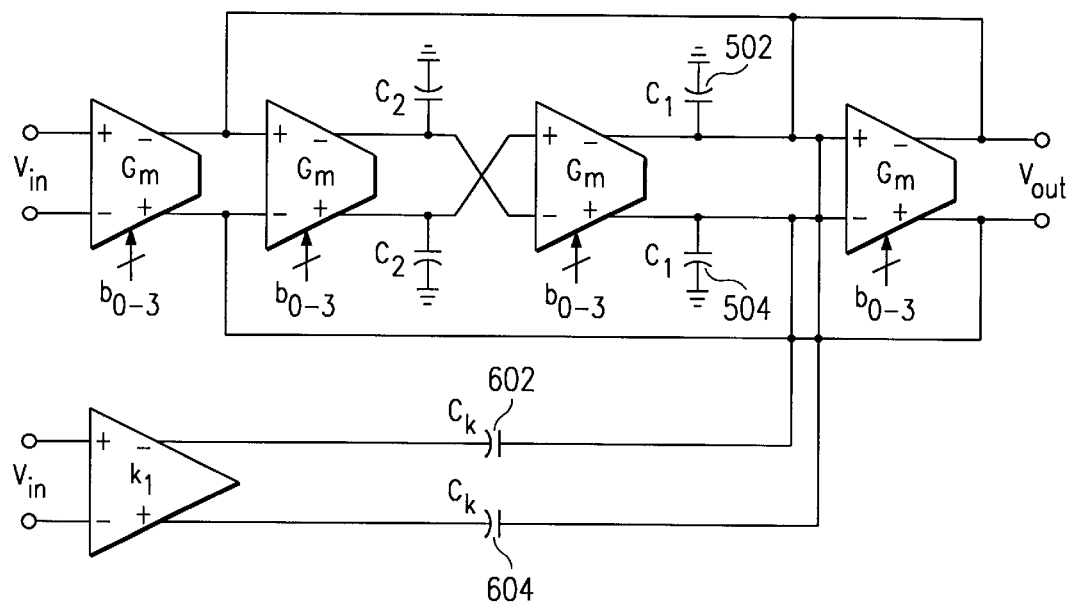
FIG. 6 illustrates the boost technique of FIG. 5.
Figure 7:
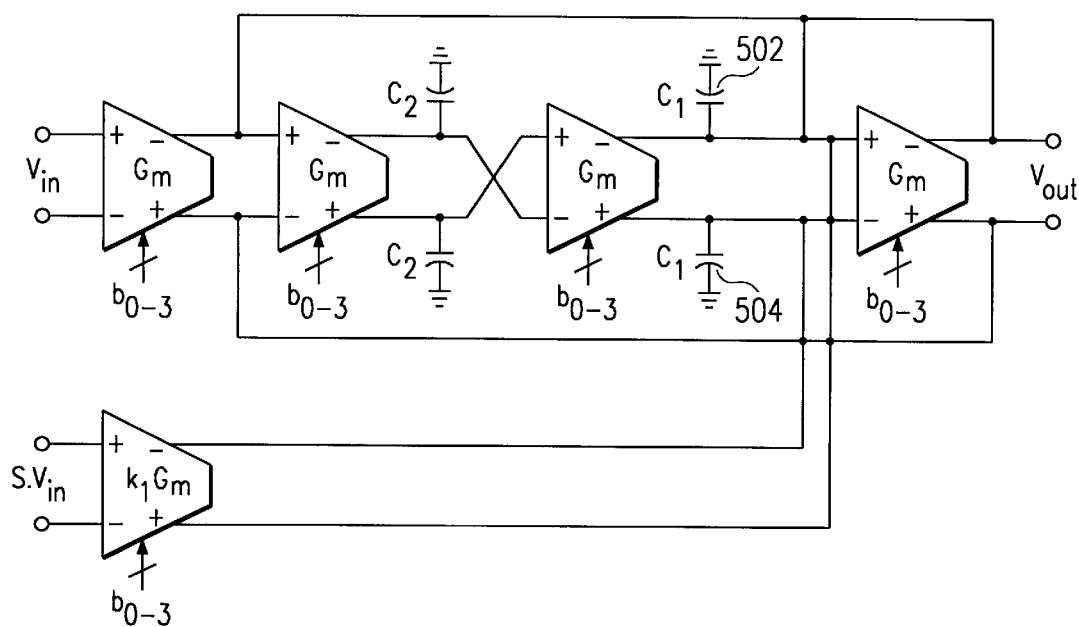
FIG. 7 illustrates another transconductance biquad with boost.
Figure 8:
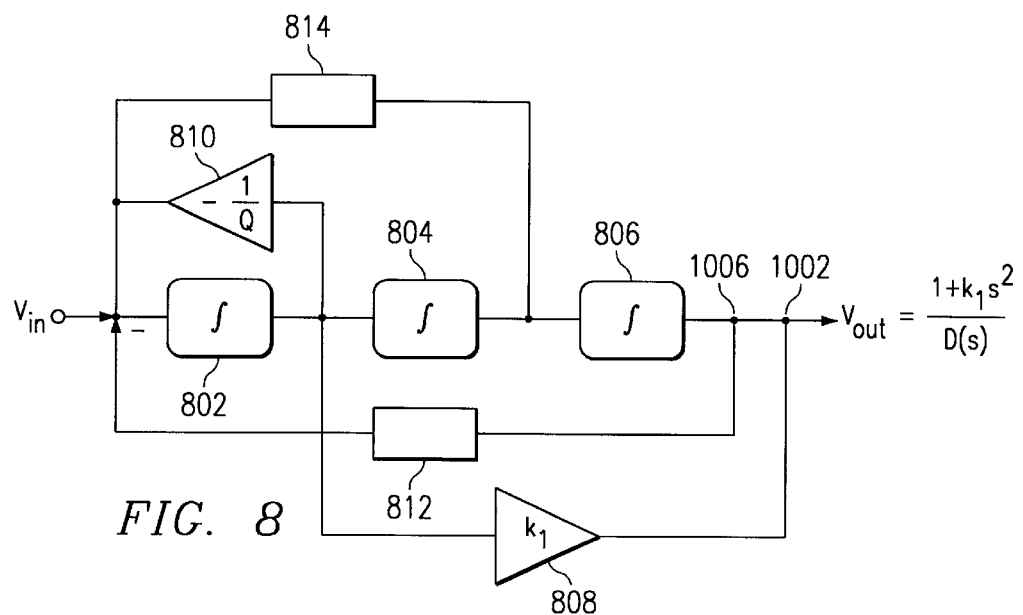
FIG. 8 illustrates a follow-the-leader (FLF) third order section.

Turning now to FIG. 8, FIG. 8 illustrates a third order biquad. With this circuit, boost is implemented by adding the outputs of the first and third integrators in a weighted fashion. Additionally, the implementation uses the current domain. Integrator 802 receives a signal input $V_{in}$ and integrates the input signal $V_{in}$ and outputs a first integrated signal at the output of integrator 802. Integrator 804 receives the first integrated signal from integrator 802 and integrates the first integrated signal. The output from integrator 804 is a second integrated signal which is output from integrator 804. The second integrated signal is input to integrator 806. The second integrated signal is input to integrator 806 which integrates the second integrated signal and outputs a third integrated signal. This third integrated signal is shown as $$V_{out} = \frac{1}{D(s)} \quad (3)$$

where D(s) is a third order polynomial.

Additionally, FIG. 8 illustrates a first feedback loop from the output of integrator 806 to the input of integrator 802, a second feedback loop from the output of integrator 804 to the input of integrator 802, and a feed forward loop from the output of integrator 802 to the output of integrator 806. A third feedback loop includes amplifier 810. The third feedback loop is connected from the output of integrator 802 to the input of integrator 802.

Figure 9:
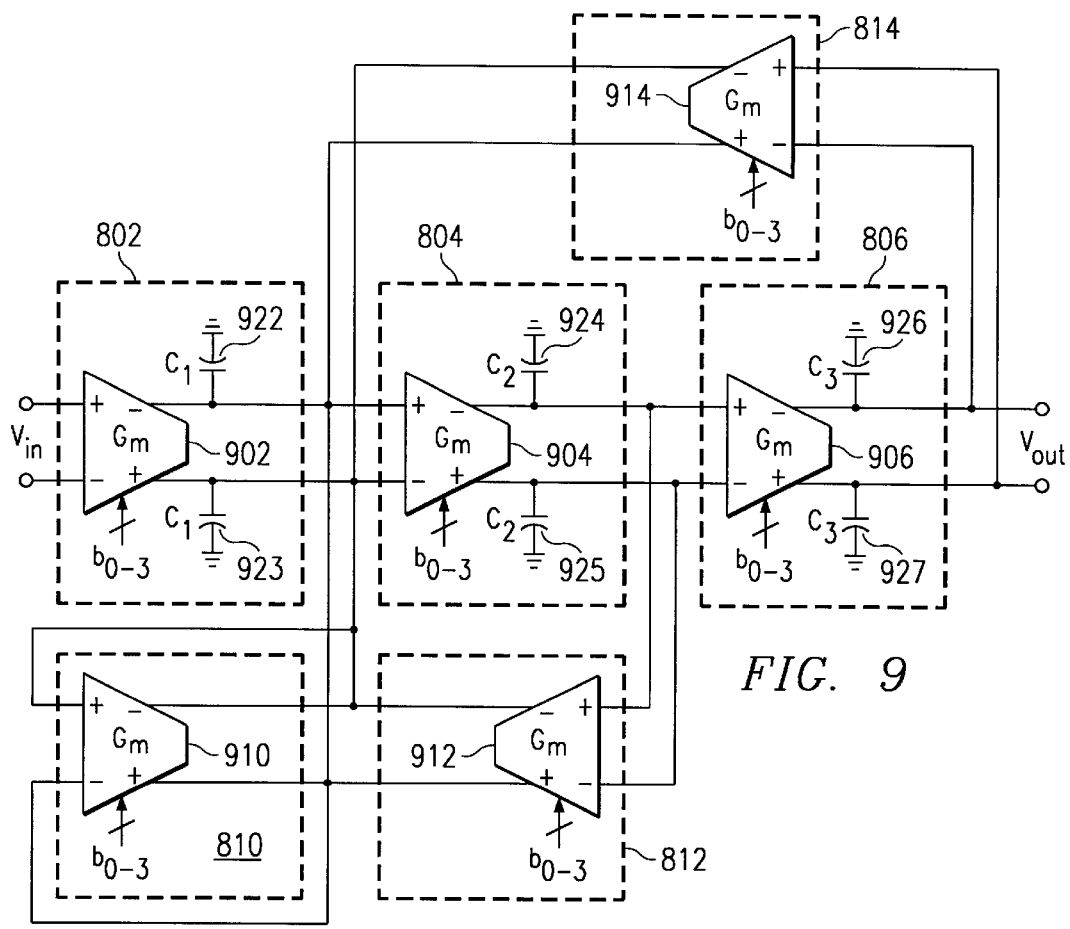
FIG. 9 illustrates the filter core for FIG. 8.

A more detailed description of FIG. 8 is illustrated in FIG. 9. As illustrated in FIG. 9, the integrator 802 is implemented in part as transconductance circuit 902. The output of transconductance circuit 902 is input to the transconductance circuit 904, capacitor 927 is connected to the negative output of transconductance circuit 902, and capacitor 923 is connected to the plus terminal of transconductance circuit 902. The negative output of transconductance circuit 902 is connected to the positive input of transconductance circuit 904. Furthermore, the plus output of transconductance circuit 902 is connected to the minus input of transconductance circuit 904. The integrator 804 includes the transconductance circuit 904. The capacitor 924 is connected to the negative output of transconductance circuit 904, and the capacitor 925 is connected to the plus terminal of transconductance circuit 904. The negative output of transconductance circuit 904 is connected to the plus input of transconductance circuit 906. The positive output of transconductance circuit 904 is connected to the negative input of transconductance circuit 906. The integrator 806 includes the transconductance circuit 906. Capacitor 926 is connected to the negative output of transconductance circuit 906, and the capacitor 922 is connected to the plus output of transconductance circuit 906. The positive input to transconductance circuit 914 is connected to the positive output of transconductance circuit 906. The negative input to transconductance circuit 914 is connected to the negative output of transconductance circuit 906. The feedback circuit 814 includes transconductance circuit 914. Additionally, the negative output of transconductance circuit 914 is connected to the negative output of transconductance circuit 910 and the negative input of transconductance circuit 904. The positive output of transconductance circuit 914 is connected to the positive output of transconductance circuit 910. Additionally, the positive output of transconductance circuit 914 is connected to the negative output of transconductance circuit 902, and the positive output of transconductance circuit 914 is connected to the negative input of transconductance circuit 910. Additionally, the positive input of transconductance circuit 910 is connected to the negative output of transconductance circuit 914. Additionally, the negative output of transconductance circuit 912 is connected to the negative input of transconductance circuit 910, and the positive output of transconductance circuit 912 is connected to the positive input of transconductance circuit 910. The feedback circuit 812 includes transconductance circuit 912. The negative output of transconductance circuit 904 is connected to the positive input of transconductance circuit 912, while the positive output of transconductance circuit 904 is connected to the negative input of transconductance circuit 912.

Figure 10:
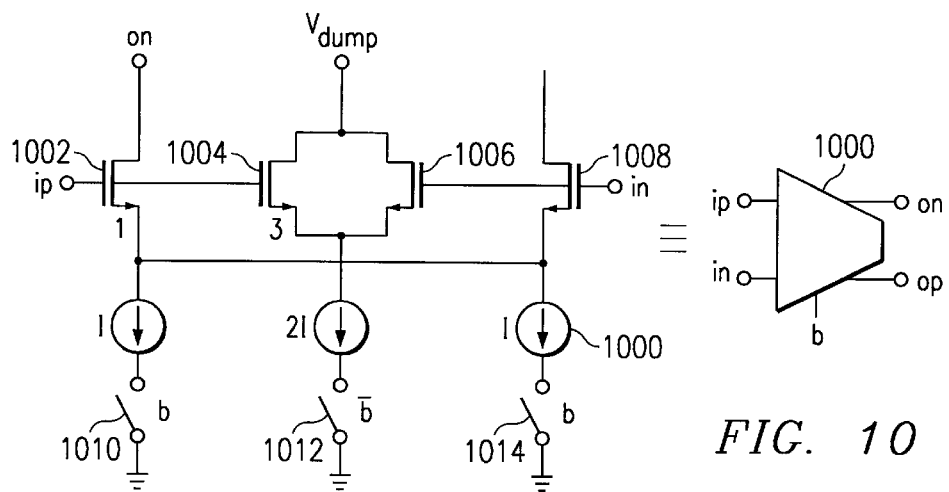
FIG. 10 illustrates a transconductance element.

FIG. 10 illustrates a digital programmable transconductance with constant input capacitance. The circuit 1000, which is a transconductor element shown in FIG. 10, can be turned on or off in accordance with the control signal b and the inverse of the control signal $\bar{b}$. This signal operates switches 1010 and 1014 while the inverse of signal b operates switch 1012. Transistors 1002, 1004, 1006 and 1008 operate in saturation.

Figure 11:
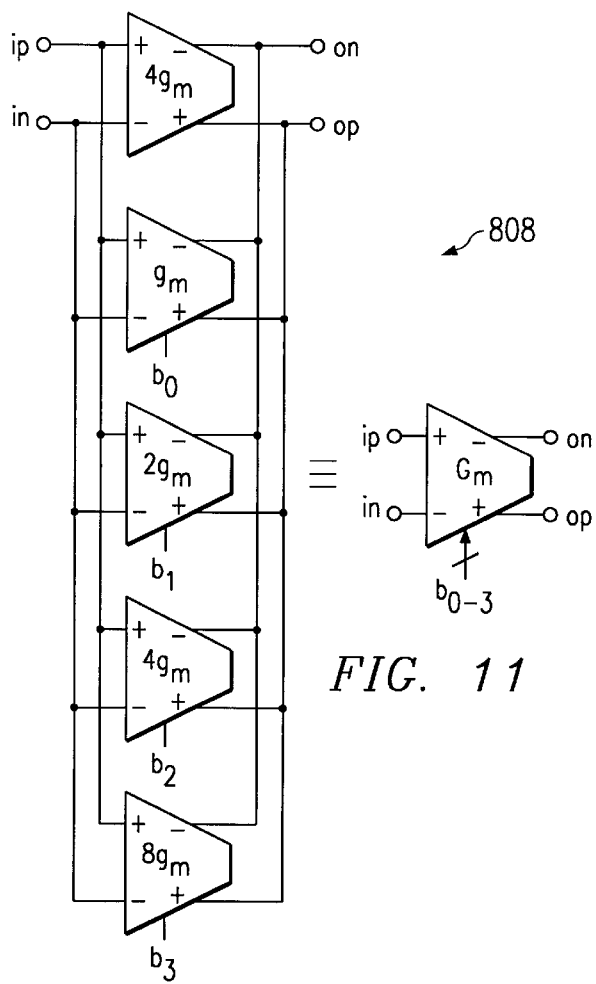
FIG. 11 illustrates a programmable transconductance array.

The transconductance element shown in FIG. 10 can be connected together in parallel to realize a digital programmable transconductance with constant input capacitance such as illustrated in FIG. 11. FIG. 11 shows different inputs, namely $b_0 b_1 b_3$, as different control signals to control the respective transconductance circuits.

Figure 12:
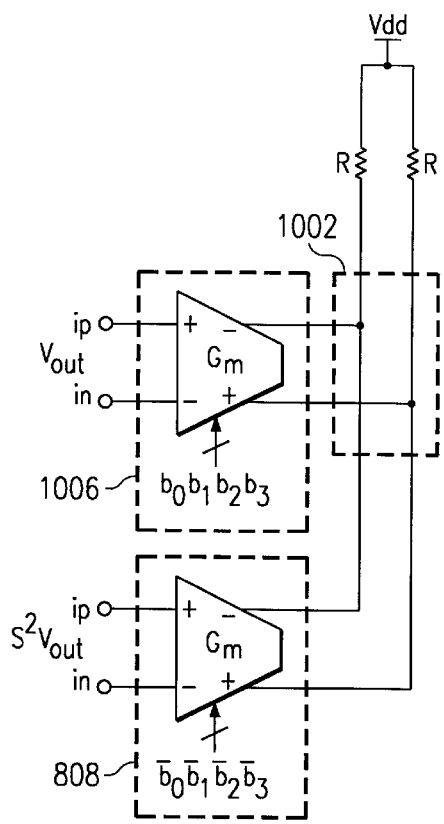
FIG. 12 illustrates a portion of the biquad implementing automatic DC gain reduction.

FIG. 12 illustrates element 1006 found in FIG. 8 and element 808 additionally illustrated in FIG. 8 connected at terminal 1002. In this figure, $V_{out}$ is the output of the follow-the-leader (FLF) section shown in FIG. 9, and the $s^2 V_{out}$ is the double differentiated output of the integrator 806, which can be obtained from the capacitors 922 and 923. The voltages $V_{out}$ and $s^2 V_{out}$ are converted into currents by means of digitally programmable constant-capacitance transconductors. The digital code controlling one transconductor, for example element 1006, is the complement of the code controlling the transconductor 808. Thus, as the digital code is increased, the amount of boost decreases, while the DC gain increases. For example, when $b_0 b_1 b_2 b_3 = 1111$, there is little boost, yet the DC gain is maximum. The sequence $b_0 b_1 b_2 b_3 = 0000$ represents a situation where the boost is maximum and the DC gain is minimum.

With the present invention, the response of the filter core remains constant irrespective of the amount of boost because the boost transconductors present a constant load to the FLF section irrespective of the boost control word. The tunability of the transconductors is restricted to the amount of boost programming required and does not need to change with bandwidth setting. The DC gain is automatically reduced as the boost is increased. The transconductors implementing boost can be different from those used in the main filter, allowing them to be independently optimized.

What is claimed is:

1. A continuous time filter being operable to boost of an input signal, comprising:

a first integrator to input the input signal and to integrate the input signal and to output a first integrated signal;

a second integrator coupled to said first integrator to input the first integrated signal and to integrate the first integrated signal and to output a second integrated signal;

a third integrator coupled to said second integrator to input the second integrated signal and to integrate the second integrated signal and to output a third integrated signal a first feedback path connected to an output of said third integrator;

a second feedback path connected to an output of said second integrator;

a third feedback path connected to an output of said first integrator; and a feedforward path connected to said output of first integrator.

2. A continuous time filter as in claim 1, wherein said first feedback path is connected to the input of said first integrator.

3. A continuous time filter as in claim 1, wherein said second feedback path is connected to the input of said first integrator.

4. A continuous time filter as in claim 1, wherein said third feedback path is connected to the input of said first integrator.

5. A continuous time filter as in claim 1, wherein said feedforward path is connected to an output of said third integrator.

* * * * *